(12) United States Patent
Ikeda

(10) Patent No.: US 10,115,754 B2
(45) Date of Patent: Oct. 30, 2018

(54) IMAGE PICKUP DEVICE AND IMAGE PICKUP SYSTEM

(71) Applicant: CANON KABUSHIKI KAISHA, Tokyo (JP)

(72) Inventor: Yasuji Ikeda, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/429,889

(22) Filed: Feb. 10, 2017

(65) Prior Publication Data

US 2017/0243905 A1  Aug. 24, 2017

(30) Foreign Application Priority Data

Feb. 19, 2016 (JP) ................................. 2016-030334

(51) Int. Cl.
| | | |
|---|---|---|
| *H01L 27/146* | (2006.01) | |
| *H04N 5/374* | (2011.01) | |
| *H04N 5/378* | (2011.01) | |
| *H04N 5/3745* | (2011.01) | |

(52) U.S. Cl.
CPC .. *H01L 27/14609* (2013.01); *H01L 27/14636* (2013.01); *H01L 27/14643* (2013.01); *H04N 5/378* (2013.01); *H04N 5/37452* (2013.01); *H04N 5/37457* (2013.01)

(58) Field of Classification Search
CPC ............... H04N 5/378; H04N 5/37452; H04N 5/37457; H01L 27/14609; H01L 27/14643; H01L 27/14636
See application file for complete search history.

(56) References Cited

U.S. PATENT DOCUMENTS

| | | | | |
|---|---|---|---|---|
| 2001/0012133 A1* | 8/2001 | Yoneda | ............. | H01L 27/14603 358/482 |
| 2007/0069248 A1* | 3/2007 | Ohta | ................. | H01L 27/14627 257/239 |
| 2012/0281262 A1* | 11/2012 | Yoneda | ............. | H01L 27/14603 358/482 |
| 2015/0189140 A1* | 7/2015 | Sutton | ................. | H04N 5/2257 348/208.1 |
| 2016/0295139 A1* | 10/2016 | Ishii | ..................... | H04N 5/3696 |

FOREIGN PATENT DOCUMENTS

| | | |
|---|---|---|
| JP | 2001-230400 A | 8/2001 |
| JP | 2005-142251 A | 6/2005 |
| JP | 2011-210837 A | 10/2011 |
| JP | 2016-40838 A | 3/2016 |

* cited by examiner

*Primary Examiner* — Abdelaaziz Tissire
(74) *Attorney, Agent, or Firm* — Canon U.S.A., Inc. IP Division

(57) ABSTRACT

Provided is an image pickup device in which intervals at which well contacts are arranged are different.

20 Claims, 12 Drawing Sheets

IMAGE PICKUP DEVICE AND IMAGE PICKUP SYSTEM

BACKGROUND OF THE INVENTION

Field of the Invention

The aspect of the embodiments relates to an image pickup device and an image pickup system.

Description of the Related Art

There is known an image pickup device including a plurality of pixels each of which includes a transistor.

In an image pickup device disclosed in Japanese Patent Laid-Open No. 2001-230400, a well region is formed in a pixel in order to form a transistor. A potential is applied to this well via a well contact.

It is considered that, in the image pickup device in Japanese Patent Laid-Open No. 2001-230400, shading can be reduced by arranging this well contact in a pixel region.

SUMMARY OF THE INVENTION

The one aspect of the embodiments is an image pickup device including: a pixel region including a plurality of pixels; a well region in which the plurality of pixels are provided; first and second well wires configured to supply a potential to the well region, the first and second well wires being arranged in the pixel region; first and second well contacts connected to the well region, the first and second well contacts being connected in the first well wire at a first interval; and third and fourth well contacts connected to the well region, the third and fourth well contacts being connected in the second well wire at a second interval different from the first interval.

Further, another aspect is an image pickup device including: a pixel region including a plurality of pixels; a well region provided over the plurality of pixels; and a plurality of well contacts configured to supply a potential to the well region, wherein lines connecting the plurality of well contacts adjacent to each other form first and second rhombuses and first and second squares, and the plurality of well contacts are arranged so that the first rhombus has first, second, and third points, the second rhombus has fourth, fifth, and sixth points, the first square has seventh, eighth, and ninth points, the second square has tenth, eleventh, and twelfth points, the first point and the third point face each other, the first point and the seventh point are a common point, the second point, the fourth point, the eighth point, and the tenth point are a common point, the third point and the twelfth point are a common point, the fifth point and the ninth point are a common point, and the sixth point and the eleventh point are a common point.

Further features of the disclosure will become apparent from the following description of exemplary embodiments (with reference to the attached drawings).

DESCRIPTION OF THE EMBODIMENTS

A MOS transistor of a pixel outputs a pixel signal corresponding to light. A potential of a source region of the MOS transistor is changed in accordance with a change in a potential of the pixel signal. The change in the potential changes a potential of a well region adjacent to the source region. The change in the potential of the well region is also a change in a potential of a back gate of the MOS transistor. Therefore, the change in the potential of the well region changes output of the MOS transistor. A time required to converge the change in the potential of the well region is increased as a time constant from a well contact to the well region is increased. Therefore, convergence of the change in the potential of the well region requires more time as a pixel is farther from the well contact. In a case where a pixel signal of a pixel is held in a state in which the change in the potential of the well region is not completely converged, a noise component caused by the change in the potential of the well region is superimposed on this pixel signal. As described above, the noise component caused by the change in the potential of the well region is superimposed more on a pixel signal as a pixel is farther from the well contact.

In a case where well contacts are arranged at a fixed period, noise components superimposed on pixel signals of a plurality of pixels also become a pattern based on the period of arrangement of the well contacts. Therefore, a periodic stripe pattern is generated in an image generated by using signals output by an image pickup device. The following technique relates to an image pickup device for outputting a signal capable of generating a high-quality image, as compared to a conventional technique.

Hereinafter, an image pickup device in each example will be described with reference to the drawings. Note that, in the following examples, a semiconductor region whose conductivity type is prescribed will be described in some cases. This conductivity type is not limited to the conductivity type in the examples and can be appropriately changed to a conductivity type opposite to the conductivity type in the examples.

EXAMPLE 1

Figure 1:
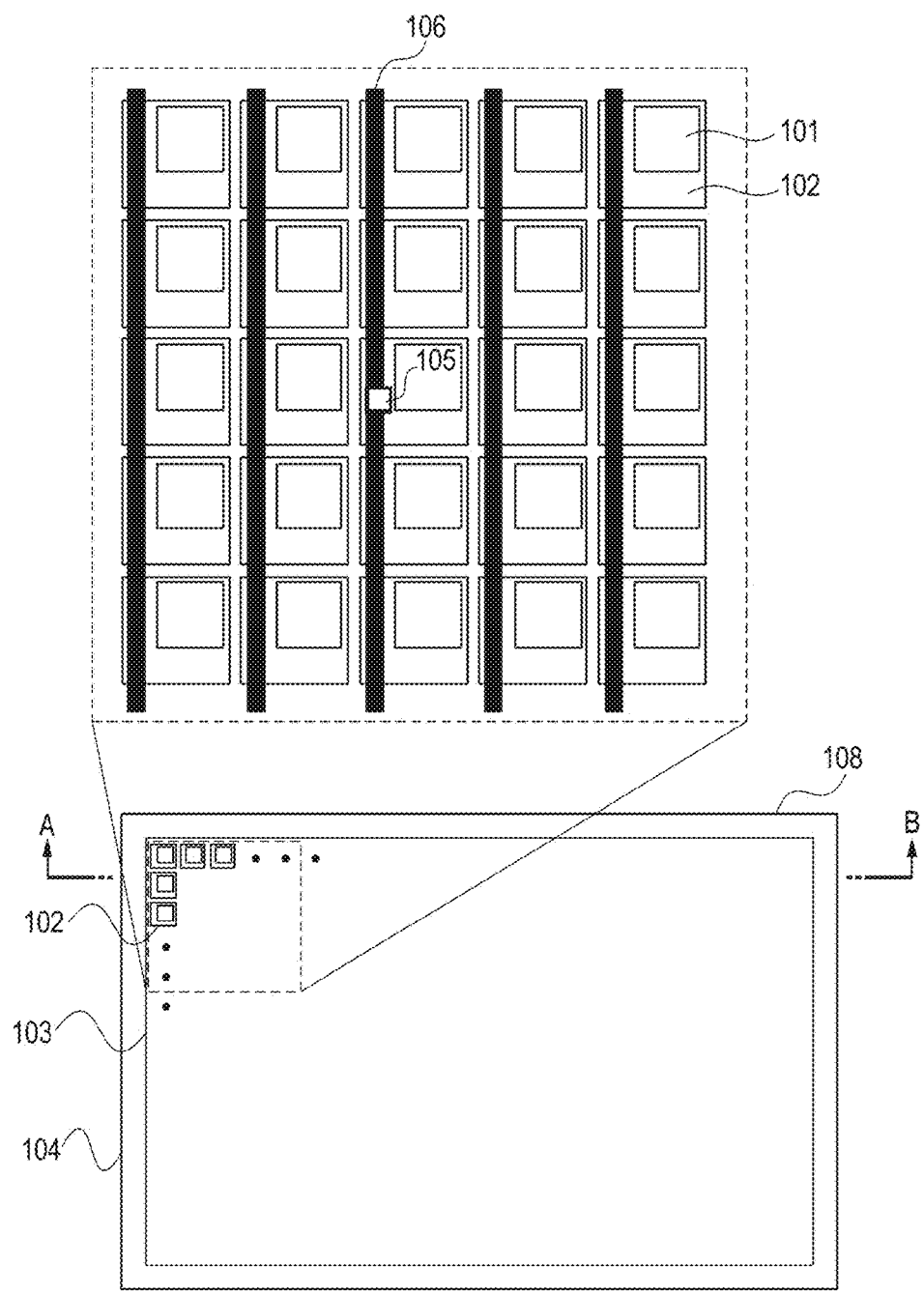
FIG. 1 shows an example of a configuration of an image pickup device.

FIG. 1 shows an image pickup device 108 in this example. In a pixel region 103, a plurality of pixels 102 are arranged in a first direction and a second direction that is a direction orthogonal to the first direction in a planar view. In this example, description will be made by defining the first direction as a direction (row direction) in which, in the pixels 102 belonging to the same column, a pixel 102 in another row is seen from a certain pixel 102. Further, description will be made by defining the second direction as a direction (column direction) in which, in the pixels 102 belonging to the same row, a pixel 102 in another column is seen from a certain pixel 102. The pixel region 103 is formed inside a well region 104. Each well contact 105 is arranged with respect to a plurality of pixels 102. Further, the well contact 105 is connected to a well wire 106. Each of the pixels 102 includes a photoelectric conversion unit 101.

Figure 2:
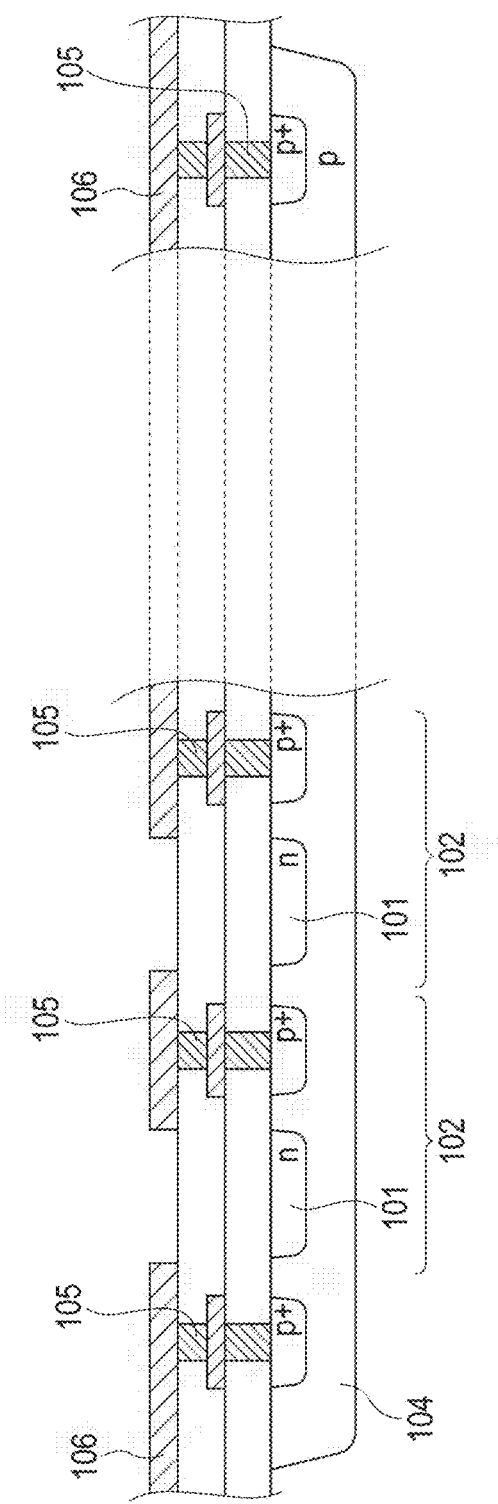
FIG. 2 shows an example of a cross section of an image pickup device.

FIG. 2 shows a cross section taken along A-B shown in FIG. 1.

The well region 104 is a p-type semiconductor region. The well contact 105 is connected to the well region 104 via a P+ region whose impurity concentration is higher than that of the well region 104. The photoelectric conversion unit 101 has an n-type semiconductor region and a p-type semiconductor region under the n-type semiconductor region. When a conductivity type of the photoelectric conversion unit 101 is defined as a first conductivity type, a conductivity type of the well region 104 is a second conductivity type opposite to the first conductivity type.

Figure 3:
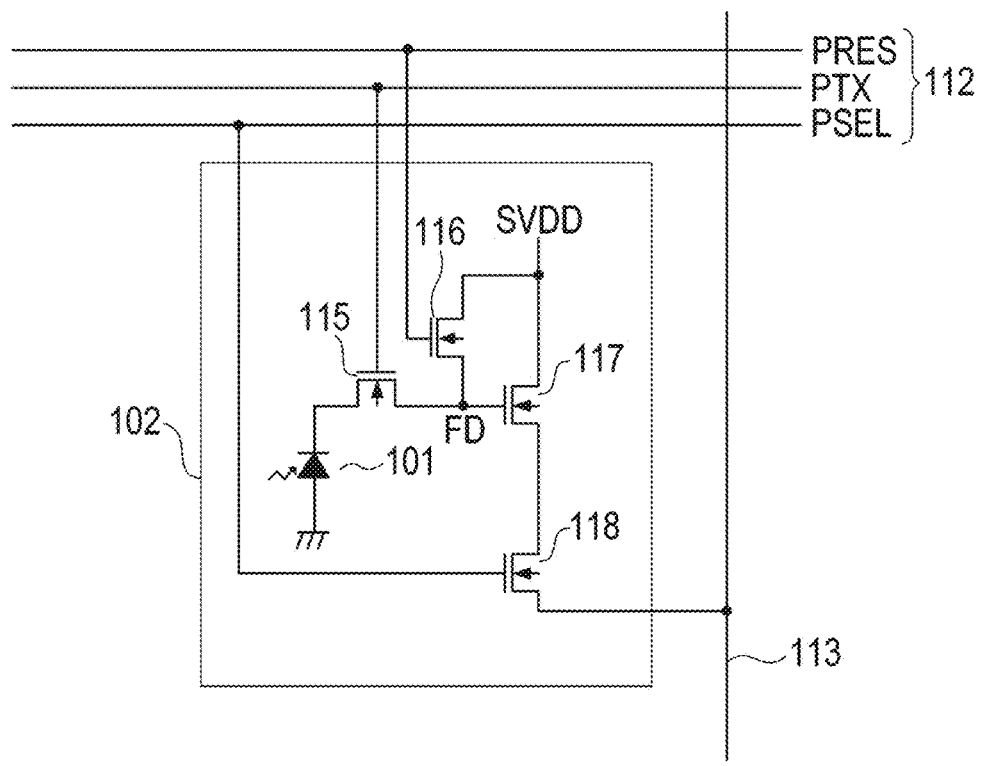
FIG. 3 shows an example of a circuit of a pixel.

FIG. 3 shows a configuration of a pixel 102. The pixel 102 shown in FIG. 3 is one of the pixels 102 included in the pixel region 103 shown in FIG. 1.

The pixel 102 includes the photoelectric conversion unit 101 and a plurality of transistors. The photoelectric conversion unit 101 generates an electric charge upon receipt of incident light. The photoelectric conversion unit 101 is connected to an input node FD of an amplifier transistor 117 via a transfer transistor 115. The input node FD is also connected to a power supply SVDD via a reset transistor 116. A first main electrode of the amplifier transistor 117 is connected to the power supply SVDD, and the second main electrode of the amplifier transistor 117 is connected to a vertical output line 113 via a selection transistor 118. A gate electrode of the selection transistor 118 is connected to a row selection line which is one of pixel control lines 112. The row selection line transmits a signal PSEL. A gate electrode of the reset transistor 116 is connected to a reset line which is one of the pixel control lines 112. The reset line transmits a signal PRES. Further, a gate electrode of the transfer transistor 115 is connected to a transfer line which is one of row control lines. The transfer line transmits a signal PTX. A vertical scanning circuit 140 is a control unit for controlling operation of the pixels 102.

When a signal PSEL becomes a high level, a current source (not shown) connected to the vertical output line 113 causes a current to flow through the amplifier transistor 117 via the vertical output line 113 and the selection transistor 118. A period of time in which the current flows through the amplifier transistor 117 is a period of time in which a signal is read from the pixel 102 to the vertical output line 113.

The amplifier transistor 117, the power supply voltage SVDD, and the current source form a source follower circuit. With this, a pixel signal corresponding to the input node FD of the amplifier transistor 117 is output from the amplifier transistor 117 to the vertical output line 113 via the selection transistor 118.

Transistors included in the pixel 102 are formed in a well region 107. Each of the transistors is a MOS transistor.

A potential of a source region of the amplifier transistor 117 is changed in accordance with a change in a potential of a pixel signal. The change in the potential changes a potential of a well region adjacent to the source region of the amplifier transistor 117. The change in the potential of the well region 107 is also a change in a potential of a back gate of the amplifier transistor 117. Therefore, the change in the potential of the well region 107 changes output of the amplifier transistor 117. A time required to converge the change in the potential of the well region 107 is increased as a pixel 102 is farther from the well contact 105. In a case where a pixel signal of a pixel is held in a state in which the change in the potential of the well region 107 is not completely converged, a noise component caused by the change in the potential of the well region 107 is superimposed on this pixel signal. As described above, the noise component caused by the change in the potential of the well region 107 is superimposed more on a pixel signal as a pixel is farther from the well contact 105.

Figure 4:
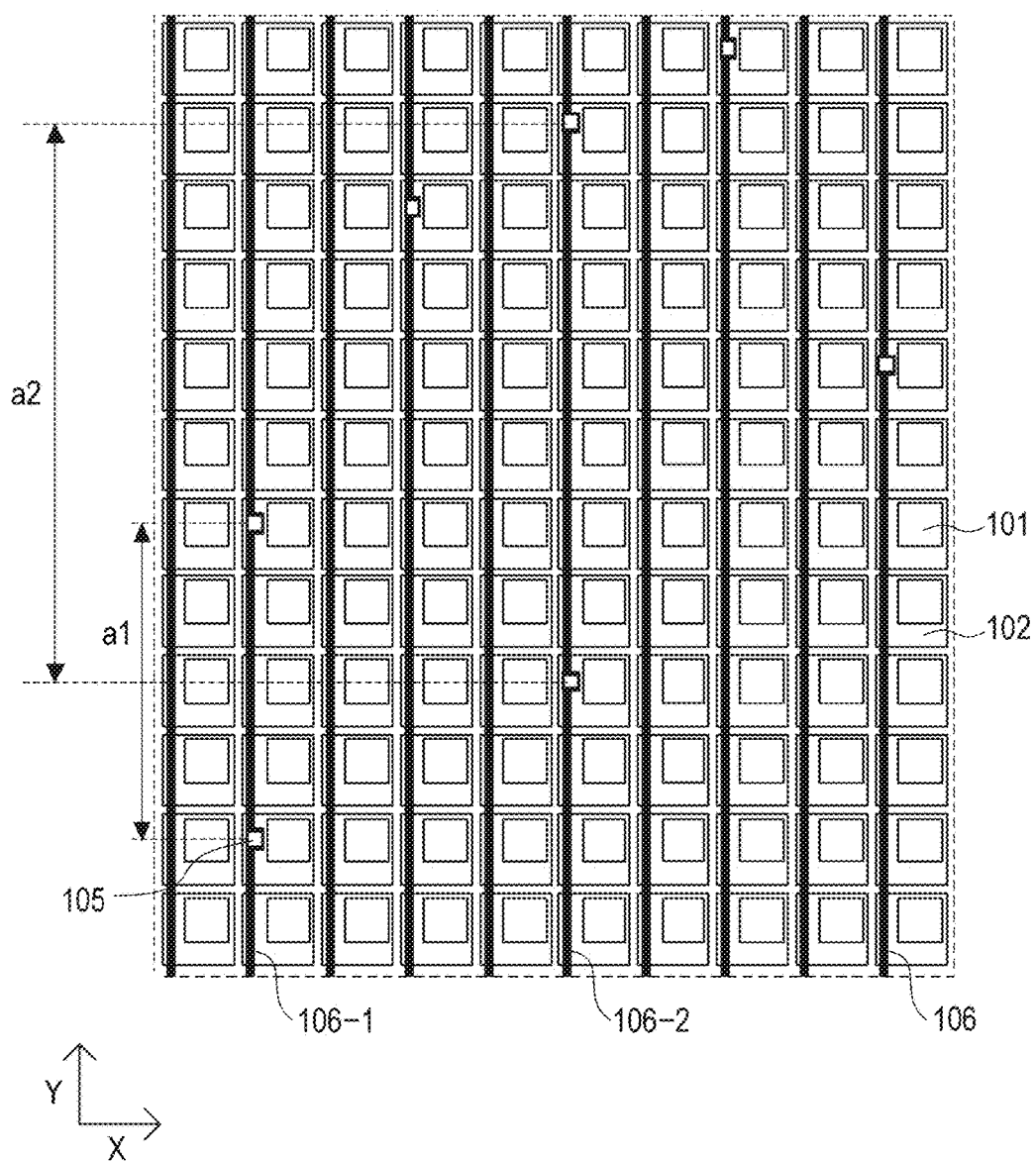
FIG. 4 shows an example of a configuration of an image pickup device.

FIG. 4 shows arrangement of the well contacts 105 of the image pickup device in this example.

A first well wire 106-1 and a second well wire 106-2 shown in FIG. 4 will be described.

An arrangement interval between the well contacts 105 in the first well wire 106-1 is a1. Meanwhile, an arrangement interval between the well contacts 105 in the second well wire 106-2 is a2, which is larger than a1.

As described above, in the image pickup device in this example, the arrangement intervals between the well contacts 105 are different between the first well wire 106-1 and the second well wire 106-2. With this, it is possible to break periodicity of arrangement of the well contacts 105. Therefore, it is possible to reduce periodic shading occurring in an image generated by using signals output by the image pickup device or prevent the shading from occurring, as compared to a case where the well contacts 105 are arranged at the same period, i.e., at the same arrangement intervals.

In this example, the case where only a single well is provided in the well region 104 has been described. However, this example is not limited to this example. In other words, the well region 104 may include a plurality of wells. Also in this case, the arrangement intervals between the well contacts 105 may be different between a first well and a second well included in the well region 104. Further, the arrangement intervals between the well contacts 105 may also be different in the first well included in the well region 104.

EXAMPLE 2

Regarding an image pickup device in this example, a difference between this example and Example 1 will be mainly described.

Figure 5:
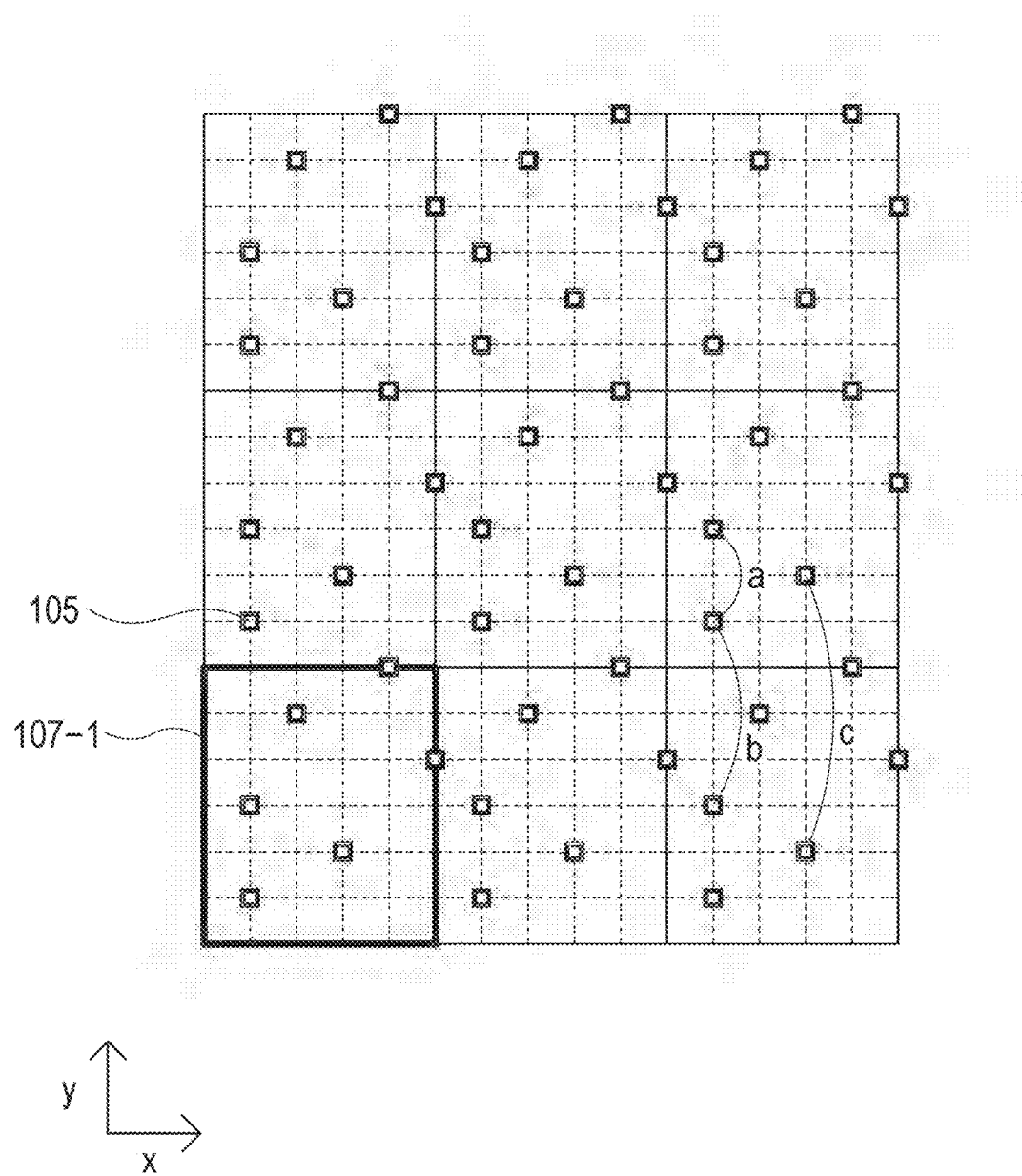
FIG. 5 shows an example of arrangement of well contacts.

FIG. 5 shows arrangement of the well contacts 105 of the image pickup device in this example.

Also in this example, the well wires 106 are extended in the first direction as described in Example 1.

In this example, the well contacts 105 are connected to the first well wire 106-1 at an interval a and an interval b. Further, the well contacts 105 are connected to the second well wire 106-2 at an interval c. As described above, arrangement intervals of the well contacts 105 are different between the first well wire 106-1 and the second well wire 106-2. Note that the image pickup device in this example includes a third well contact 105 between the first or second well contact 105 and the first or second well contact 105 in the first well wire 106-1. In addition, in the image pickup device in this example, the interval a that is an interval between the first and third well contacts 105 is different from the interval b that is an interval between the second and third well contacts 105. The interval a and the interval b are also different from the interval c that is an arrangement interval of the well contacts 105 in the second well wire 106-2 different from the first well wire 106-1.

Regarding arrangement of the well contacts 105 in the well region 107, arrangement of the well contacts 105 is defined as unit arrangement and this unit arrangement is repeated. A well region corresponding to the unit arrangement is a partial well region 107-1.

As described above, in the image pickup device in this example, an arrangement pattern of the well contacts 105 is random in the partial well region 107-1. With this, the image pickup device in this example can obtain the same effect as that of the image pickup device in Example 1. Meanwhile, in the image pickup device in this example, the arrangement pattern of the well contacts 105 in the partial well region 107-1 is repeated in a plurality of partial well regions 107-1. With this, regarding the image pickup device in this example, it is possible to simplify a design of an exposure mask pattern used for producing the image pickup device, as compared to a case where arrangement patterns of the well contacts 105 are different between the plurality of partial well regions 107-1. Further, the image pickup device in this example can obtain the effect described in Example 1.

EXAMPLE 3

Regarding an image pickup device in this example, a difference between this example and Example 2 will be mainly described.

Also in this example, the well wires 106 are extended in the first direction as described in Example 1.

In the image pickup device in Example 2, the arrangement pattern of the well contacts 105 is random in a direction in which, in the same column, a pixel 102 in one row is seen from a pixel 102 in another row (hereinafter, referred to as "row direction").

In the image pickup device in this example, the arrangement pattern of the well contacts 105 is random in a direction in which, in the same row, a pixel 102 in one column is seen from a pixel 102 in another column (hereinafter, referred to as "column direction").

Figure 6:
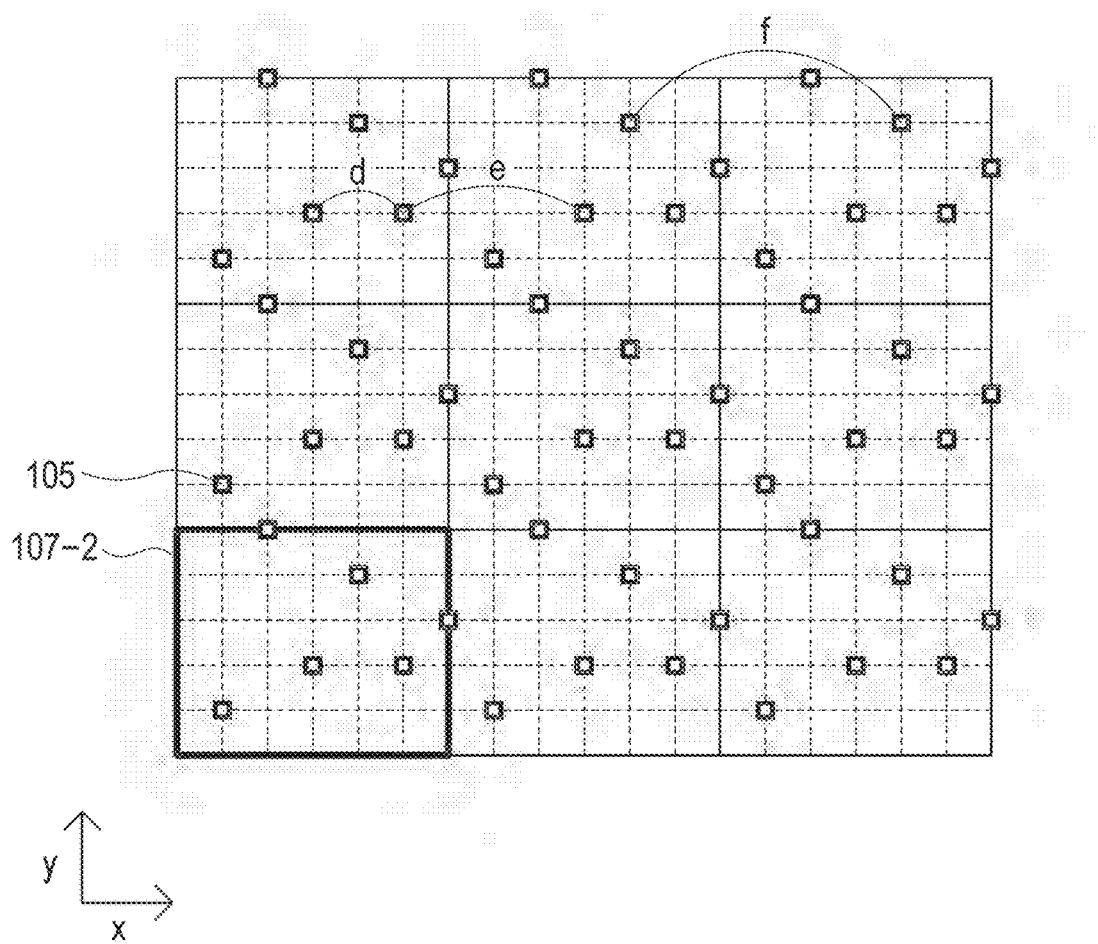
FIG. 6 shows an example of arrangement of well contacts.

FIG. 6 shows arrangement of the well contacts 105 of the image pickup device in this example. Note that the well wires 106 are arranged to extend in the row direction as in Example 1 and Example 2. In the well contacts 105 in a certain row, an interval d that is an interval between the first and third well contacts 105 is different from an interval e that is an interval between the second and third well contacts 105. Further, the interval d and the interval e are also different from an interval f that is an interval between the well contacts 105 in another row.

One of the well contacts 105 arranged at the interval d is connected to the first well wire 106-1, and the other one is connected to the second well wire 106-2. Further, one of the well contacts arranged at the interval e is connected to the second well wire 106-2, and the other one is connected to a third well wire 106.

An arrangement relationship between the well contacts 105 provided at the interval d and the interval e is as follows. The well contact 105 connected to the second well wire 106-2 is provided at an intersection of a line extended from the well contact 105 connected to the first well wire 106-1 in the second direction (column direction) at the interval d and the second well wire 106-2. Further, the well contact 105 connected to the third well wire 106 is provided at an intersection of a line extended from the well contact 105 connected to the first well wire 106-1 in the second direction (column direction) at an interval of a sum total of the interval e and the interval d and the third well wire 106.

Further, also in this example, the well region 107 is divided into a plurality of partial well regions 107-2 in a pseudo manner. In addition, an arrangement pattern of the well contacts 105 in a single partial well region 107-2 is repeated in the plurality of partial well regions 107-2.

With this, the image pickup device in this example can also obtain the same effect as that of the image pickup device in Example 2.

Figure 7:
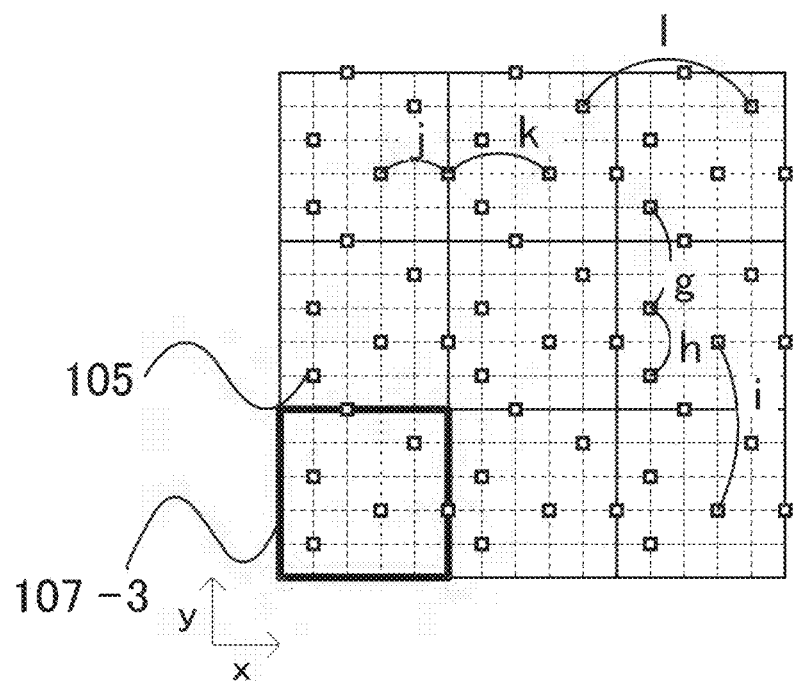
FIG. 7 shows an example of arrangement of well contacts.

Further, arrangement of the well contacts 105 of the image pickup device is, for example, arrangement obtained by combining Example 2 and Example 3 as shown in FIG. 7.

EXAMPLE 4

Regarding an image pickup device in this example, a difference between this example and Example 3 will be mainly described.

Also in this example, the well wires 106 are extended in the first direction as described in Example 1.

Figure 8:
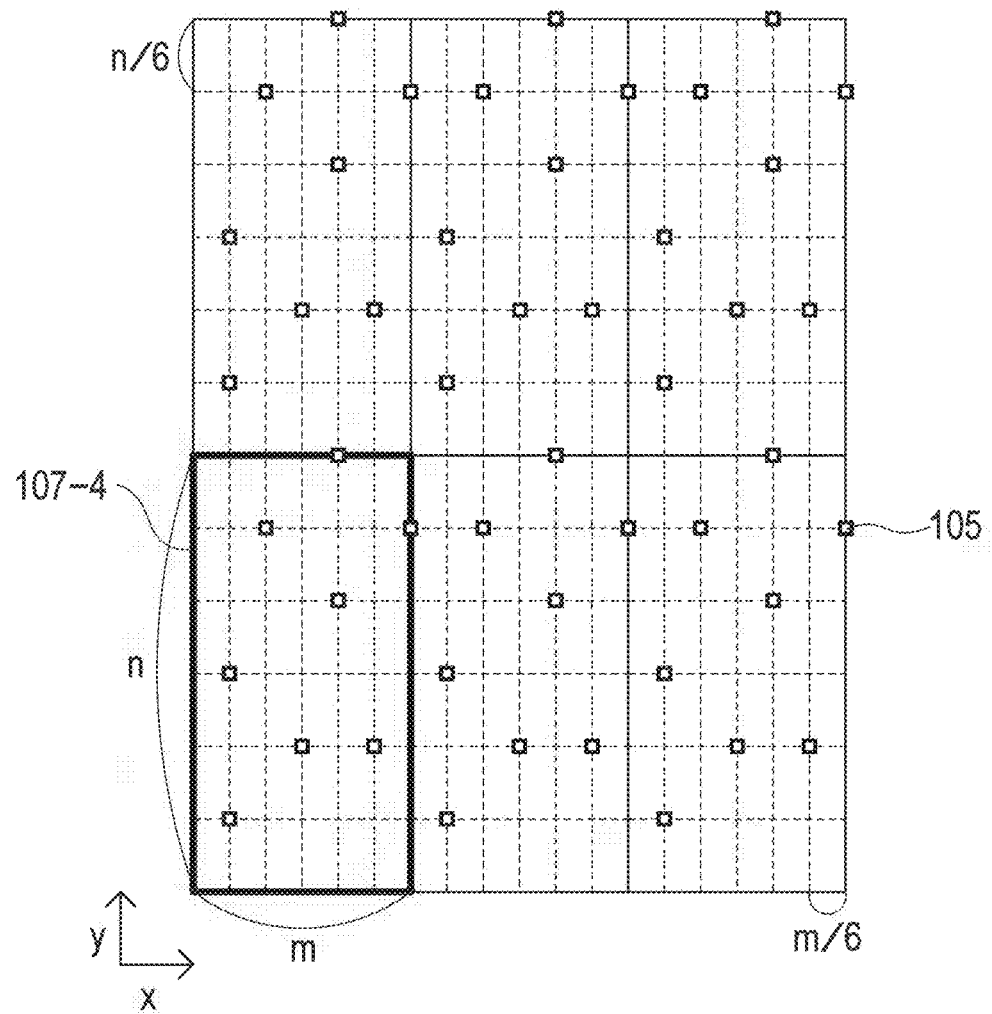
FIG. 8 shows an example of arrangement of well contacts.

FIG. 8 shows arrangement of the well contacts 105 of the image pickup device in this example.

A length of a partial well region 107-4 in an X direction (example of column direction) is m, and a length thereof in a Y direction (example of row direction) is n, which is different from m. Hereinafter, a lower left position of the partial well region 107-4 is defined as an origin, and a coordinate of the well contact 105 is expressed as (x, y). In FIG. 8, the X direction and the Y direction are also expressed as a small-letter x direction and a small-letter y direction, respectively. In this example, the well contacts 105 are arranged at positions corresponding to (m/6, n/6), (m/6, 3n/6), (2m/6, 5n/6), (3m/6, 2n/6), (4m/6, 4n/6), (4m/6, 6n/6), (5m/6, 2n/6), and (6m/6, 5n/6).

An arrangement pattern of the well contacts 105 in the partial well region 107-4 is repeated in a plurality of partial well regions 107-4. Therefore, the coordinates of the well contacts 105 described above prescribe relative positions of the well contacts 105.

Figure 9:
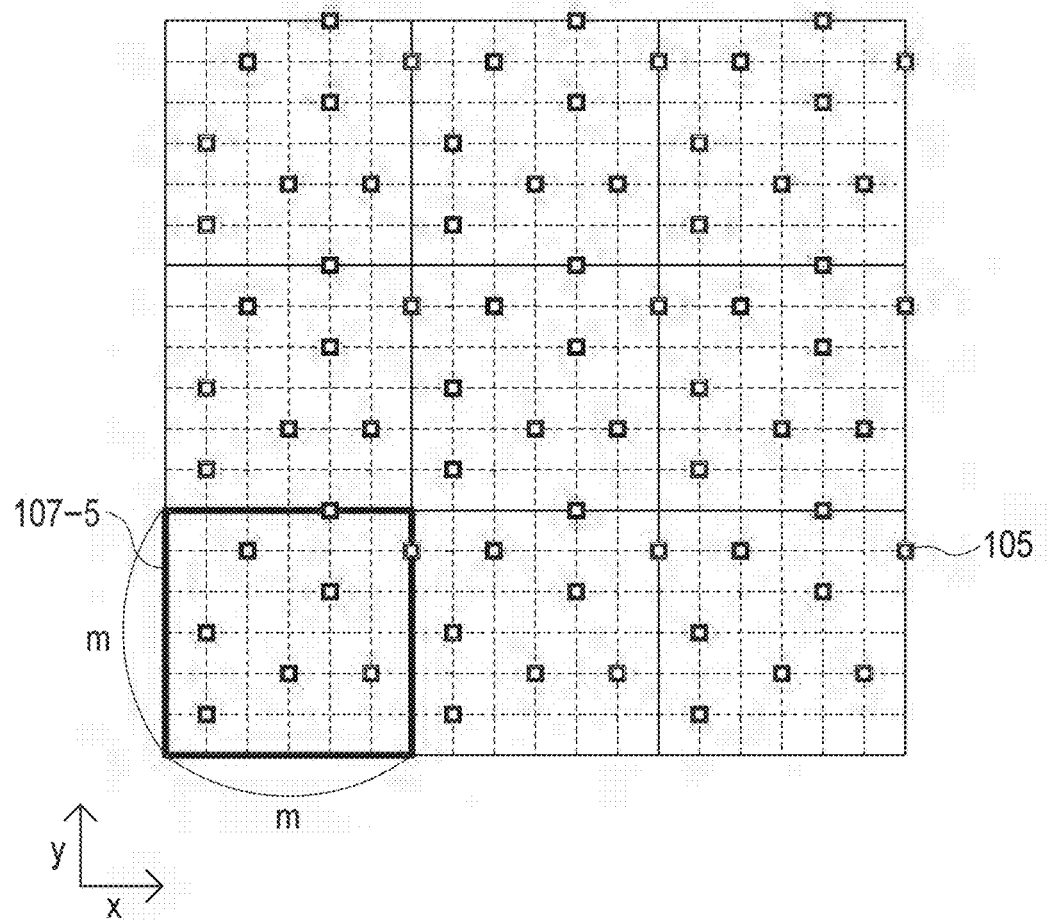
FIG. 9 shows an example of arrangement of well contacts.

That is, in a case where the relative positions of the well contacts are the same as the above arrangement when the well contacts are repeatedly arranged, the origin may be moved to any position in FIG. 9. In that case, positions of the well contacts 105 are positions offset from the positions prescribed above by an amount of movement of the origin.

Also in this example, it is possible to obtain the same effect as that of the image pickup device in Example 3.

Further, the arrangement pattern of the well contacts 105 in the partial well region 107-4 is not limited to the arrangement pattern shown in FIG. 8. In other words, the arrangement pattern in the partial well region 107-4 shown in FIG. 8 may be inverted in vertical and horizontal directions or may be rotated. Also in that case, it is possible to obtain the same effect as the effect obtained by the image pickup device in this example.

EXAMPLE 5

Regarding an image pickup device in this example, a difference between this example and Example 4 will be mainly described.

Also in this example, the well wires 106 are extended in the first direction as described in Example 1.

FIG. 9 shows arrangement of the well contacts 105 of the image pickup device in this example.

In the image pickup device in Example 4, the length of the partial well region 107-4 in the row direction is different from the length thereof in the column direction. In the image pickup device in this example, a partial well region 107-5, which is repetition of an arrangement pattern of the well contacts 105, has the same length m in the row direction and the column direction.

A lower left position of the partial well region 107-5 is defined as an origin, and a coordinate of the well contact 105 is expressed as (x, y). In this example, the well contacts 105 are arranged at positions corresponding to (m/6, m/6), (m/6, 3m/6), (2m/6, 5m/6), (3m/6, 2m/6), (4m/6, 4m/6), (4m/6, 6m/6), (5m/6, 2m/6), and (6m/6, 5m/6).

Figure 10:
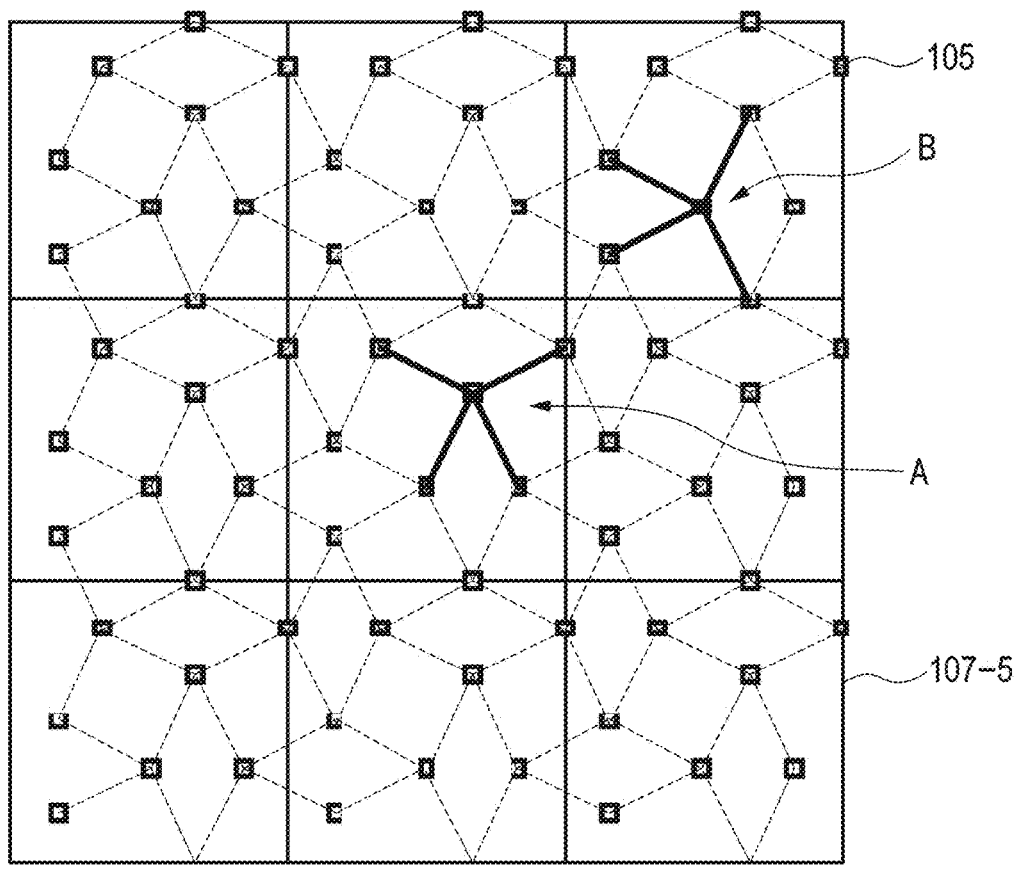
FIG. 10 shows an example of arrangement of well contacts.
Figure 11:
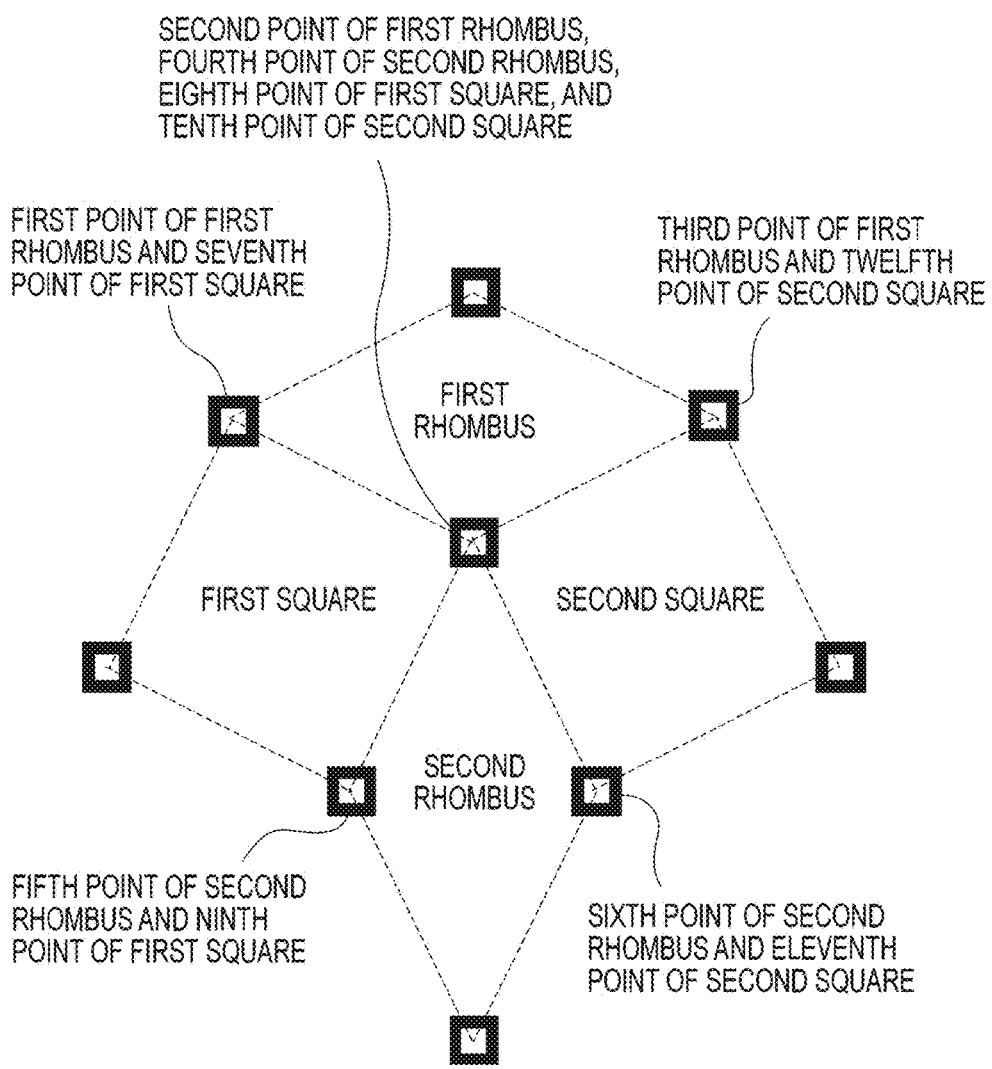
FIG. 11 shows an example of arrangement of well contacts.

FIG. 10 shows a part of arrangement of the well contacts 105 shown in FIG. 9. In an arrangement layout shown in FIG. 10, a unit set including two rhombuses and two squares shown in FIG. 11 is repeatedly arranged. This unit set will be described with reference to FIG. 11. The unit set of arrangement of the well contacts 105 shown in FIG. 11 includes a first rhombus, a second rhombus, a first square, and a second square. All sides of the first rhombus, the second rhombus, the first square, and the second square have the same length. Further, all the sides of the first rhombus, the second rhombus, the first square, and the second square are lines connecting the well contacts 105 adjacent to each other.

The first rhombus has a first point to a third point. The first point and the third point face each other.

The second rhombus has a fourth point to a sixth point.

The first square has a seventh point to a ninth point.

The second square has a tenth point to a twelfth point.

The first point of the first rhombus and the seventh point of the first square are a common point.

The second point of the first rhombus, the fourth point of the second rhombus, the eighth point of the first square, and the tenth point of the second square are a common point.

The third point of the first rhombus and the twelfth point of the second square are a common point.

The fifth point of the second rhombus and the ninth point of the first square are a common point.

The sixth point of the second rhombus and the eleventh point of the second square are a common point.

In the arrangement layout shown in FIG. 10, the well contacts 105 are arranged so that the unit set is repeated. With this arrangement, influences of potentials received from other adjacent well contacts 105 can be the same in the well contacts 105 at any positions. A well contact 105 at a position A shown in FIG. 10 will be described. The well contact 105 at the position A and another adjacent well contact 105 have a positional relationship shown by four sides, all of which are shared by rhombuses and squares as indicated by thick lines in FIG. 10. Similarly, the well contact 105 at a position B shown in FIG. 10 and another adjacent well contact 105 have a positional relationship shown by four sides, all of which are shared by rhombuses and squares as indicated by thick lines in FIG. 10. A figure formed by lines connecting the well contact A and adjacent well contacts 105 is the same as a figure formed by lines connecting the well contact B and adjacent well contacts 105. In other words, influences of potentials received from other adjacent well contacts 105 upon the well contact A can be equal to the influences upon the well contact B.

Therefore, arrangement of the well contacts 105 of the image pickup device in this example can apply a substantially uniform well potential to the pixel region 103. With this, it is possible to reduce shading occurring in an image generated by using signals output by the image pickup device.

EXAMPLE 6

This example relates to an image pickup system including the image pickup device in each example described above.

Figure 12:
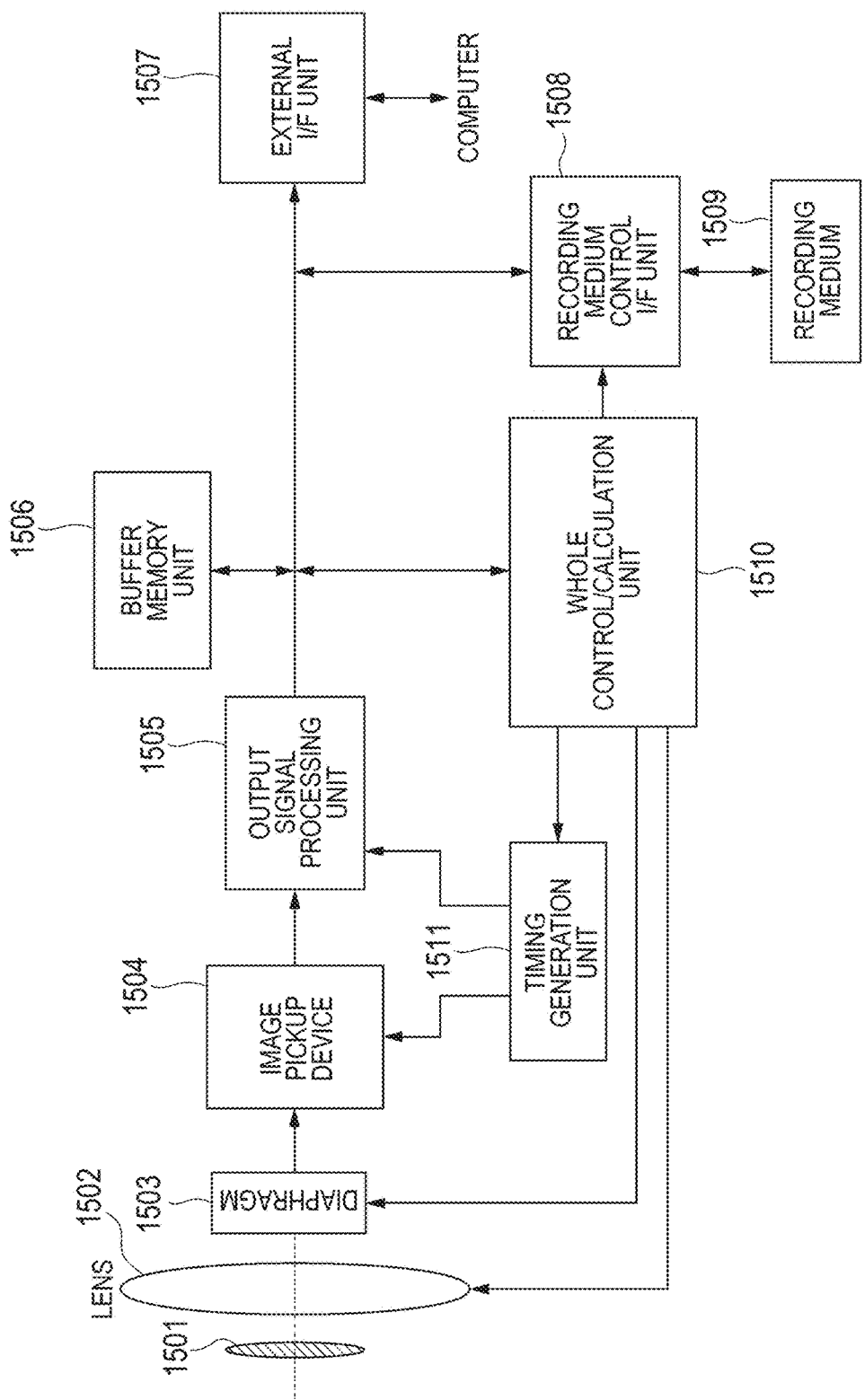
FIG. 12 shows an example of a configuration of an image pickup system.

The image pickup system is, for example, a digital still camera, a digital camcorder, or a monitoring camera. FIG. 12 shows a schematic diagram obtained in a case where an image pickup device is applied to a digital still camera as an example of the image pickup system.

The image pickup system shown in FIG. 12 includes a barrier 1501 for protecting a lens, a lens 1502 for focusing an optical image of a subject on an image pickup device 1504, and a diaphragm 1503 for changing an amount of light passing through the lens 1502. The lens 1502 and the diaphragm 1503 are an optical system for collecting light to the image pickup device 1504. The image pickup system shown in FIG. 12 also includes an output signal processing unit 1505 for processing an output signal output by the image pickup device 1504. The output signal processing unit 1505 variously corrects or compresses a signal as necessary and then outputs the signal. This signal is typically image data.

The image pickup system shown in FIG. 12 further includes a buffer memory unit 1506 for temporarily storing image data and an external interface unit 1507 for communicating with an external computer or the like. The image pickup system further includes a detachable storage medium 1509 used for recording or reading image data, such as a semiconductor memory, and a recording medium control interface unit 1508 for performing recording or reading on the storage medium 1509. The image pickup system further includes a whole control calculation unit 1510 for performing various kinds of calculation and controlling the whole digital still camera and a timing supply unit 1511 for outputting various kinds of timing signals to the image pickup device 1504 and the output signal processing unit 1505. Herein, the timing signals and the like may be input from the outside, and the image pickup system may only include at least the image pickup device 1504 and the output signal processing unit 1505 for processing an output signal output from the image pickup device 1504.

As described above, the image pickup system in this example can perform image pickup operation by applying the image pickup device 1504.

Note that the above examples merely show concrete examples for implementing the aspect of the embodiments, and the technical scope of the aspect of the embodiments should not be restrictively interpreted on the basis of the examples. That is, the aspect of the embodiments can be implemented in various forms without departing from the technical spirit thereof or main features thereof. Further, the examples described above can be variously implemented in combination.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-030334, filed Feb. 19, 2016, which is hereby incorporated by reference herein in its entirety.

What is claimed is:

1. An image pickup device, comprising:
a pixel region including a plurality of pixels;
a well region in which the plurality of pixels are provided;
first and second well wires configured to supply a potential to the well region, the first and second well wires being arranged in the pixel region;
first and second well contacts connected to the well region, the first and second well contacts being connected in the first well wire at a first interval; and
third and fourth well contacts connected to the well region, the third and fourth well contacts being connected in the second well wire at a second interval larger than the first interval, a number of pixels arranged in the second interval is larger than a number of pixels arranged in the first interval.

2. The image pickup device according to claim 1, wherein an arrangement pattern of the well contacts including the first to fourth well contacts is repeated in the well region.

3. The image pickup device according to claim 2, wherein the plurality of pixels are arranged in a first direction and a second direction orthogonal to the first direction in a planar view, and a length of a period in which the arrangement pattern of the well contacts is repeated in the first direction is the same as a length of the period in the second direction.

4. The image pickup device according to claim 3, further comprising a fifth well contact connected to the well region and arranged in the first well wire with respect to the second well contact at an interval different from the first interval, and a sixth well contact connected to the well region and arranged in the second well wire with respect to the fifth well contact at an interval different from the second interval.

5. The image pickup device according to claim 2, wherein the plurality of pixels are arranged in a first direction and a second direction orthogonal to the first direction in a planar view, and a length of a period in which the arrangement pattern of the well contacts is repeated in the first direction is different from a length of the period in the second direction.

6. The image pickup device according to claim 5, further comprising a fifth well contact connected to the well region and arranged in the first well wire with respect to the second well contact at an interval different from the first interval, and a sixth well contact connected to the well region and arranged in the second well wire with respect to the fifth well contact at an interval different from the second interval.

7. The image pickup device according to claim 2, wherein the plurality of pixels are arranged in a first direction and a second direction orthogonal to the first direction in a planar view, the image pickup device further includes a third well wire, the first, second, and third well wires are extended in the first direction, fifth and sixth well contacts connected to the well region are provided at intersections of a line extended from the first well contact in the second direction and the second and third well wires, and an interval between the first well contact and the fifth well contact is different from an interval between the fifth well contact and the sixth well contact.

8. The image pickup device according to claim 7, further comprising the fifth well contact connected to the well region and arranged in the first well wire with respect to the second well contact at an interval different from the first interval, and the sixth well contact connected to the well region and arranged in the second well wire with respect to the fifth well contact at an interval different from the second interval.

9. The image pickup device according to claim 2, further comprising a fifth well contact connected to the well region and arranged in the first well wire with respect to the second well contact at an interval different from the first interval, and a sixth well contact connected to the well region and arranged in the second well wire with respect to the fifth well contact at an interval different from the second interval.

10. The image pickup device according to claim 1, wherein the plurality of pixels are arranged in a first direction and a second direction orthogonal to the first direction in a planar view, the image pickup device further includes a third well wire, the first, second, and third well wires are extended in the first direction, fifth and sixth well contacts connected to the well region are provided at intersections of a line extended from the first well contact in the second direction and the second and third well wires, and an interval between the first well contact and the fifth well contact is different from an interval between the fifth well contact and the sixth well contact.

11. The image pickup device according to claim 10, further comprising the fifth well contact connected to the well region and arranged in the first well wire with respect to the second well contact at an interval different from the first interval, and the sixth well contact connected to the well region and arranged in the second well wire with respect to the fifth well contact at an interval different from the second interval.

12. The image pickup device according to claim 1, further comprising a fifth well contact connected to the well region and arranged in the first well wire with respect to the second well contact at an interval different from the first interval, and a sixth well contact connected to the well region and arranged in the second well wire with respect to the fifth well contact at an interval different from the second interval.

13. An image pickup device, comprising:
a pixel region including a plurality of pixels;
a well region provided over the plurality of pixels; and
a plurality of well contacts configured to supply a potential to the well region, wherein
lines connecting the plurality of well contacts adjacent to each other form first and second rhombuses and first and second squares, and
the plurality of well contacts are arranged so that
the first rhombus has first, second, and third points,
the second rhombus has fourth, fifth, and sixth points,
the first square has seventh, eighth, and ninth points,
the second square has tenth, eleventh, and twelfth points,
the first point and the third point face each other,
the first point and the seventh point are a common point,
the second point, the fourth point, the eighth point, and the tenth point are a common point,
the third point and the twelfth point are a common point,
the fifth point and the ninth point are a common point, and
the sixth point and the eleventh point are a common point.

14. The image pickup device according to claim 13, wherein the first and second rhombuses and the first and second squares are defined as a unit set, and the plurality of unit sets are arranged in the well region.

15. An image pickup system, comprising:
an image pickup device; and a signal processing unit configured to generate image data by using signals output by the image pickup device, wherein the image pickup device includes a pixel region including a plurality of pixels, a well region in which the plurality of pixels are provided, first and second well wires configured to supply a potential to the well region, the first and second well wires being arranged in the pixel region, first and second well contacts connected to the well region, the first and second well contacts being connected in the first well wire at a first interval, and third and fourth well contacts connected to the well region, the third and fourth well contacts being connected in the second well wire at a second interval larger than the first interval, a number of pixels arranged in the second interval is larger than a number of pixels arranged in the first interval.

16. The image pickup system according to claim 15, wherein the image pickup device further includes an arrangement pattern of the well contacts including the first to fourth well contacts is repeated in the well region.

17. The image pickup system according to claim 16, wherein the plurality of pixels are arranged in a first direction and a second direction orthogonal to the first direction in a planar view, and a length of a period in which the arrangement pattern of the well contacts is repeated in the first direction is the same as a length of the period in the second direction.

18. The image pickup system according to claim 16, wherein the plurality of pixels are arranged in a first direction and a second direction orthogonal to the first direction in a planar view, and a length of a period in which the arrangement pattern of the well contacts is repeated in the first direction is different from a length of the period in the second direction.

19. The image pickup system according to claim 15, wherein the plurality of pixels are arranged in a first direction and a second direction orthogonal to the first direction in a planar view, the image pickup device further includes a third well wire, the first, second, and third well wires are extended in the first direction, fifth and sixth well contacts connected to the well region are provided at intersections of a line extended from the first well contact in the second direction and the second and third well wires, and an interval between the first well contact and the fifth well contact is different from an interval between the fifth well contact and the sixth well contact.

20. An image pickup system, comprising:

an image pickup device; and a signal processing unit configured to generate image data by using signals output by the image pickup device, wherein the image pickup device includes a pixel region including a plurality of pixels, a well region provided over the plurality of pixels, and a plurality of well contacts configured to supply a potential to the well region, lines connecting the plurality of well contacts adjacent to each other form first and second rhombuses and first and second squares, and the plurality of well contacts are arranged so that the first rhombus has first, second, and third points, the second rhombus has fourth, fifth, and sixth points, the first square has seventh, eighth, and ninth points, the second square has tenth, eleventh, and twelfth points, the first point and the third point face each other, the first point and the seventh point are a common point, the second point, the fourth point, the eighth point, and the tenth point are a common point, the third point and the twelfth point are a common point, the fifth point and the ninth point are a common point, and the sixth point and the eleventh point are a common point.

* * * * *